United States Patent
Ryan

(10) Patent No.: US 8,349,731 B2
(45) Date of Patent: Jan. 8, 2013

(54) METHODS FOR FORMING COPPER DIFFUSION BARRIERS FOR SEMICONDUCTOR INTERCONNECT STRUCTURES

(75) Inventor: Errol Todd Ryan, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 52 days.

(21) Appl. No.: 13/072,502

(22) Filed: Mar. 25, 2011

(65) Prior Publication Data

US 2012/0244698 A1    Sep. 27, 2012

(51) Int. Cl.
*H01L 21/44* (2006.01)

(52) U.S. Cl. ........ 438/653; 438/627; 438/629; 438/643; 438/645; 438/654; 438/660; 438/679; 438/687; 438/693; 257/486; 257/751; 257/E21.081

(58) Field of Classification Search .......... None
See application file for complete search history.

(56) References Cited

U.S. PATENT DOCUMENTS 7,166,543 B2 *  1/2007  Russell et al. ................ 438/778

OTHER PUBLICATIONS

Taylor et al. ("Reaction of Vapordeposited Aluminum with Copper Oxides", J. of Vaccum Sci. and Techn. A, 9, pp. 1840-1846, 1991).*

* cited by examiner

*Primary Examiner* — Julio J Maldonado
*Assistant Examiner* — Yasser Abdelaziez
(74) *Attorney, Agent, or Firm* — Ingrassia Fisher & Lorenz, P.C.

(57) ABSTRACT

Embodiments of methods for forming Cu diffusion barriers for semiconductor interconnect structures are provided. The method includes oxidizing an exposed outer portion of a copper line that is disposed along a dielectric substrate to form a copper oxide layer. An oxide reducing metal is deposited onto the copper oxide layer. The copper oxide layer is reduced with at least a portion of the oxide reducing metal that oxidizes to form a metal oxide barrier layer. A dielectric cap is deposited over the metal oxide barrier layer.

20 Claims, 3 Drawing Sheets

METHODS FOR FORMING COPPER DIFFUSION BARRIERS FOR SEMICONDUCTOR INTERCONNECT STRUCTURES

FIELD OF THE INVENTION

The present invention relates generally to semiconductor interconnect structures, and more particularly relates to methods for forming copper (Cu) diffusion barriers for semiconductor interconnect structures.

BACKGROUND OF THE INVENTION

Integrated circuits (ICs) typically include a plurality of semiconductor devices and interconnect wiring. Networks of metal interconnect wiring are often used to connect the semiconductor devices from the semiconductor portion of the substrate. Multiple levels of metal interconnect wiring above the semiconductor portion of the substrate are connected together to form a back-end-of-the-line ("BEOL") interconnect structure. Within such a structure, metal lines run parallel to the substrate and conductive vias run perpendicular to the substrate. The conductive vias typically interconnect the different levels of the metal wiring levels.

Two developments in the last decade have contributed to increased performance of contemporary ICs. One such development is the use of copper as the interconnect metal of the BEOL interconnect structure. Copper is advantageous because it has a higher conductivity compared with the other traditionally used interconnect metals, such as, for example, aluminum (Al).

A second development is the employment within the BEOL interconnect structure of a low dielectric constant (low k) dielectric material as the interlevel dielectric (ILD) layer or layers. By "low k," it is meant that the dielectric constant of a particular dielectric material is less than that of silicon dioxide. The low k dielectric alternatives may be non-porous, porous or a combination of porous and non-porous. When copper is used as the metal in the interconnect wiring layers, a dielectric barrier layer or "dielectric cap" is typically required between the copper features and the ILD to prevent copper from diffusing into certain types of ILD materials so as to prevent the copper from damaging the electrical properties of the dielectric. Unfortunately, even with the dielectric cap positioned over the copper lines, some electromigration or diffusion of the copper atoms at the interface between the dielectric cap and the copper lines in the direction of the flow of electrons can occur. A void or short circuit in the copper line can occur as a result of the electromigration, thereby causing the semiconductor device to fail.

Accordingly, it is desirable to provide methods for forming Cu diffusion barriers that inhibit electromigration of copper atoms along copper lines that are formed in semiconductor interconnect structures. Furthermore, other desirable features and characteristics of the present invention will become apparent from the subsequent detailed description and the appended claims, taken in conjunction with the accompanying drawings and the foregoing technical field and background of the invention.

SUMMARY OF THE INVENTION

Methods for forming Cu diffusion barriers for semiconductor interconnect structures are provided herein. In accordance with an exemplary embodiment, a method for forming a Cu diffusion barrier for a semiconductor interconnect structure includes oxidizing an exposed outer portion of a copper line that is disposed along a dielectric substrate to form a copper oxide layer. An oxide reducing metal is deposited onto the copper oxide layer. The copper oxide layer is reduced with at least a portion of the oxide reducing metal that oxidizes to form a metal oxide barrier layer. A dielectric cap is deposited over the metal oxide barrier layer.

In accordance with another exemplary embodiment, a method for forming a Cu diffusion barrier for a semiconductor interconnect structure is provided. The method includes oxidizing an exposed outer portion of a copper line that is disposed along a dielectric substrate to form a copper oxide layer. An oxide reducing metal is deposited onto the dielectric substrate and the copper oxide layer to form a metal covered dielectric substrate. The metal covered dielectric substrate is annealed at conditions effective to cooperatively reduce the copper oxide layer and oxidize the oxide reducing metal to form a metal oxide barrier layer overlaying the copper line. A dielectric cap is deposited over the metal oxide barrier layer.

BRIEF DESCRIPTION OF THE DRAWINGS

Embodiments of the present invention will hereinafter be described in conjunction with the following drawing figures, wherein like numerals denote like elements, and wherein.

DETAILED DESCRIPTION

Figure 1:
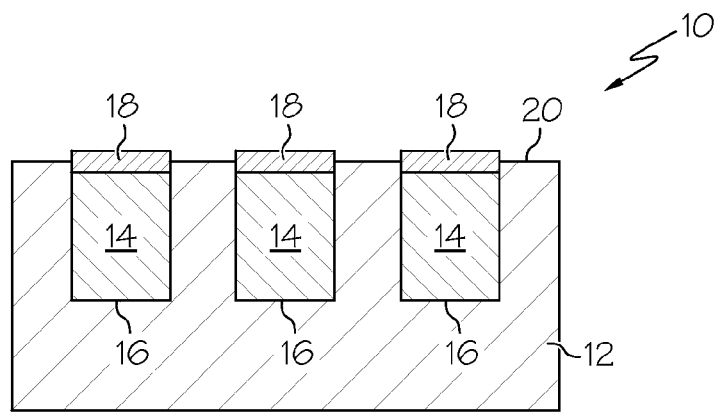
FIG. 1-7B schematically illustrate, in cross-sectional views, a semiconductor interconnect structure during stages of its fabrication in accordance with exemplary embodiments.

The following Detailed Description is merely exemplary in nature and is not intended to limit the invention or the application and uses of the invention. Furthermore, there is no intention to be bound by any theory presented in the preceding Background of the Invention or the following Detailed Description.

Various embodiments contemplated herein relate to methods for forming Cu diffusion barriers for semiconductor interconnect structures. During intermediate stages of the fabrication of a semiconductor interconnect structure, an exposed outer portion of a copper line (e.g. copper wire) that is disposed along a dielectric substrate in a trench formed in the dielectric substrate is oxidize to form a copper oxide layer along the upper portion of the copper line. In an exemplary embodiment, the exposed outer portion of the copper line is oxidize by being exposed to ambient air and the thickness of the copper oxide layer may be increased or decreased as desired by using an annealing process that employs an oxidizing atmosphere (e.g. oxygen-rich atmosphere) or a reducing atmosphere (e.g. ammonia or hydrogen rich atmosphere), respectively. An oxide reducing metal (e.g. manganese, aluminum, or the like) is deposited onto the dielectric substrate covering the surface of the dielectric substrate and the copper oxide layer.

In an exemplary embodiment, the metal covered dielectric substrate is then annealed at conditions effective to cause an oxidation-reduction reaction between the copper oxide and the oxide reducing metal such that the copper oxide layer is reduced to copper and the portion of the oxide reducing metal immediately overlying and in contact with the copper oxide layer is oxidize to form a metal oxide barrier layer. In a preferred embodiment, the oxide reducing metal that is disposed laterally adjacent to the copper line overlying and in contact with the surface of the dielectric substrate is not oxidized. This results in the metal oxide barrier layer being naturally or self-aligned with the copper line without being formed onto or into the surrounding dielectric substrate which may otherwise result in current leakage issues. In one example, the oxide reducing metal is manganese, which reduces the copper oxide layer, and is oxidized during the annealing process to form a manganese oxide layer that is a barrier layer self-aligned with the copper line. A selective wet etch process or a chemical-mechanical polish (CMP) process may then be used to remove the remaining manganese or other oxide reducing metal without removing the manganese oxide or other metal oxide that forms the barrier layer. A dielectric cap material (e.g. silicon nitride, SiCN (N-Blok), or the like) is deposited onto the surface of the dielectric substrate and the magnesium oxide or other metal oxide barrier layer to form a dielectric cap. The Inventor has found that the metal oxide barrier layer inhibits copper electromigration or diffusion of copper atoms along the interface between the copper line and the dielectric cap of the semiconductor interconnect structure, which preferably results in improved reliability of the semiconductor device without the formation of voids or short circuits in the copper interconnect lines.

FIGS. 1-7B illustrate schematically, in cross-sectional view, a semiconductor interconnect structure 10 and process steps for fabricating the interconnect structure 10 in intermediate fabrication stages. As illustrated in FIG. 1, the semiconductor interconnect structure 10 includes an interlevel dielectric substrate or interlevel dielectric (ILD) 12 and copper lines 14 disposed in trenches 16 formed in the ILD 12.

The interconnect structure 10 is typically located on a semiconductor substrate (not shown) or is one of several interconnect structures that are stacked together to implement the circuit function being implemented on the semiconductor substrate. The semiconductor substrate contains, for example, various electronic devices including a plurality of interconnected field effect transistors (FETs) or MOS transistors in the form of CMOS, NMOS, and/or PMOS elements. The copper lines 14 in the ILD 12 run parallel to the ILD 12 and conductive vias (not shown) run perpendicular to the ILD 12 to interconnect the different levels of the copper lines in the BEOL with the various electronic devices on the semiconductor substrate.

The ILD 12 may be formed from various dielectric materials preferably having a dielectric constant of about 4 or less, more preferably of about 3.5 or less. The dielectric materials that may be used to form the ILD 12 include inorganic dielectrics or organic dielectrics that are porous, nonporous or contain regions and/or surfaces that are porous and other regions and/or surfaces that are nonporous. Some non-limiting examples of ILD dielectric materials are silsesquioxanes, organosilicates that include atoms of Si, C, O, and H, polymeric materials such as thermosetting polyarylene ethers, or multilayers thereof. The thickness of the ILD 12 may vary depending upon the dielectric material used. Typically, the ILD 12 has a thickness from about 50 to about 1000 nm.

The ILD 12 is formed by utilizing any conventional process, such as, for example, a deposition process including plasma enhanced chemical vapor deposition (PECVD), chemical vapor deposition (CVD), evaporation, and chemical solution deposition. After forming the ILD 12, lithography and etching are used to form the trenches 16 and other openings (e.g. for vias) as is well known in the art. A thin liner or barrier material, such as, for example, Ta, TaN, Ti, TiN, and the like, and a thin copper seed layer may be deposited into the trenches 16, and copper is subsequently deposited (e.g. via electroplating) into the trenches 16 to form the copper lines 14. The upper surface 20 of the of the ILD 12 and the copper lines 14 are preferably made coplanar by being polished and cleaned by a CMP process.

A copper oxide layer 18 is formed on each of the exposed surfaces of the copper lines 14. In an exemplary embodiment, the copper oxide layer 18 forms naturally by exposing the upper surfaces of the copper lines 14 to ambient air. Depending upon the desired thickness of the copper oxide layer 18, the copper lines 14 may be exposed to ambient air for a time from about a few minutes to about several days for example.

Figure 2:
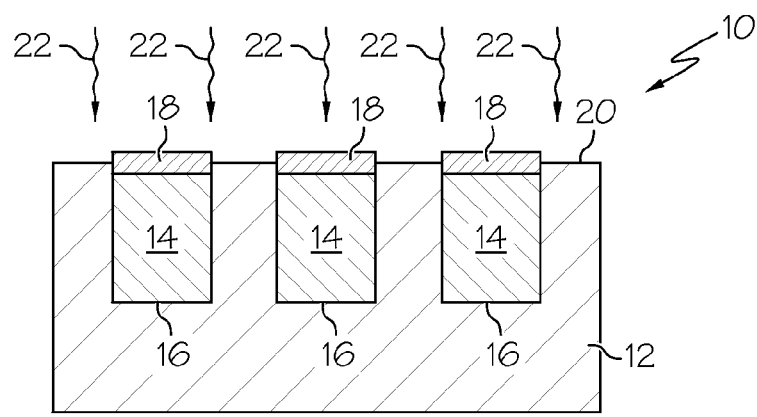

In an exemplary embodiment as illustrated FIG. 2, the thickness of the copper oxide layer 18 may be increased or decreased as desired by subjecting the semiconductor interconnect structure 10 to an optional annealing process 22. For example, the copper oxide layer 18 may be increased in thickness by exposing the semiconductor interconnect structure 10 to the annealing process 22 that has an oxygen-rich atmosphere. In an alternative example, the copper oxide layer 18 may be decreased in thickness by exposing the semiconductor interconnect structure 10 to the annealing process 22 that has a reducing atmosphere containing, for example, an ammonia or hydrogen rich atmosphere. The inventor has found that by controlling the thickness of the copper oxide layer 18 to a desired level, subsequent processing including removing excess manganese from the semi-interconnect structure 10, such as, for example, via a CMP process as will be discussed in further detail below, is facilitated.

In one embodiment, the semiconductor interconnect structure 10 is exposed to a temperature of preferably from about 200 to about 400° C. for a time from about 2 minutes to several hours, and more preferably from about 2 minutes to about 2 hours during the annealing process 22. As will be discussed further below, the copper oxide participates in an oxidation-reduction reaction with an oxide reducing metal to form a metal oxide barrier layer for inhibiting electromigration of copper. Therefore, the thickness or the amount of copper oxide formed on the copper lines 14 affects the thickness or the amount of the metal oxide barrier layer subsequently formed on the copper lines 14. Accordingly, being able to adjust the thickness of the copper oxide layers 18 preferably provides a means for controlling the thickness of the subsequently formed metal oxide barrier layer, which limits diffusion of copper atoms therethrough, and therefore, provide a means for influencing the effectiveness of the metal oxide barrier layer for inhibiting electromigration of copper.

Figure 3:
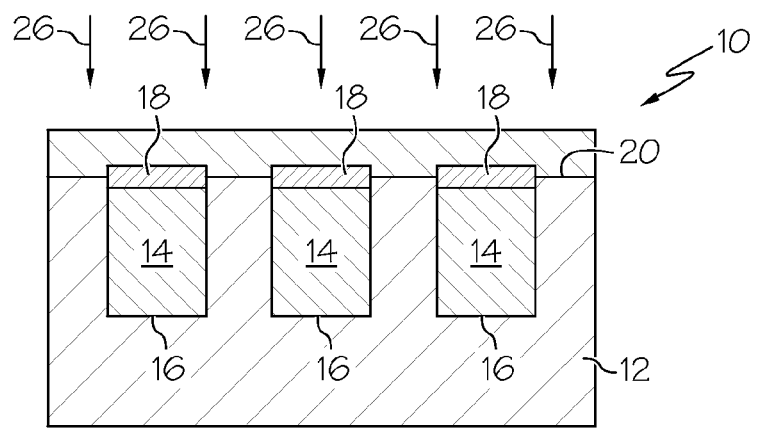

In an exemplary embodiment as illustrated in FIG. 3, an oxide reducing metal material is deposited onto the copper oxide layers 18 and the upper surface 20 of the ILD 12 by a deposition process 26 to form an oxide reducing metal layer 24. The oxide reducing metal layer 24 may be formed from any metal that reduces copper oxide to copper and becomes oxidized by oxygen from the copper oxide to form a barrier material that inhibits copper electromigration. Some non-limiting examples of oxide reducing metals are manganese and aluminum, and preferably manganese. The deposition process 26 is preferably a physical vapor deposition process, but other deposition processes known to those skilled in the art may also be used. Notably, however, the deposition process 26 does not need to be a selective deposition process because, as will be explained further below, the subsequently formed barrier layers are self-aligned with the copper lines 14 due to the localized direct oxygen exchange between the copper oxide layer 18 and the oxide reducing metal layer 24 during the oxidation-reduction reaction.

Figure 4:
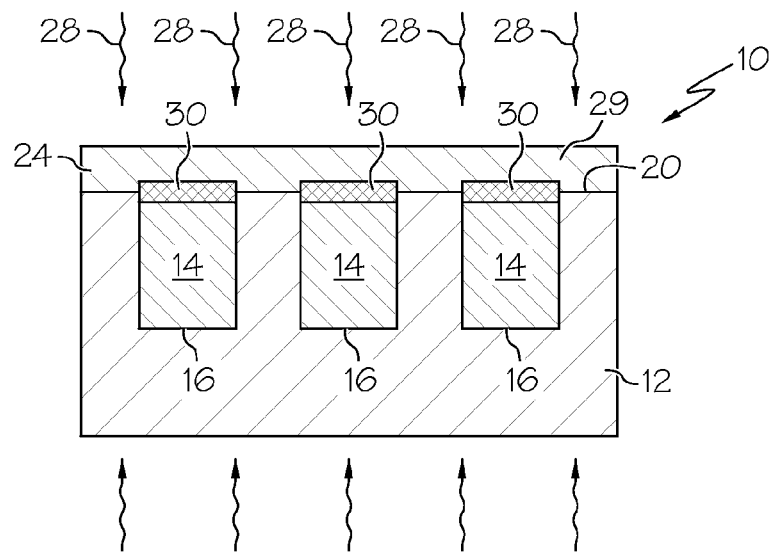

In an exemplary embodiment as illustrated in FIG. 4, the semiconductor interconnect structure 10 covered with the oxide reducing metal layer 24 is subjected to an annealing process 28 at conditions effective to cause an oxidation-reduction reaction between the copper oxide layers 18 and localized portions of the oxide reducing metal layer 24 that are in contact with the copper oxide layers 18 to form metal oxide barrier layers 30 while the remaining portion 29 of the oxide reducing metal layer 24 is left unchanged. In particular, the oxidation-reduction reaction causes the localized portions of the oxide reducing metal layer 24 to become oxidized with oxygen from the copper oxide layers 18 to produce the metal oxide barrier layers 30 overlaying and self-aligned with the copper lines 14. During this reaction, the copper oxide is reduced to copper. For example, if the oxide reducing metal layer 24 is formed of manganese, then the metal oxide barrier layers 30 are formed of manganese oxide. Alternatively, if the oxide reducing metal layer is formed of aluminum, then the metal oxide barrier layers 30 are formed of aluminum oxide. The Inventor has found that manganese oxide and aluminum oxide, and most preferably manganese oxide, are effective barrier materials for inhibiting electromigration of copper.

In an exemplary embodiment, the annealing process 28 includes an operating temperature from about 200 to about 450° C., and most preferably from about 350 to about 400° C. In another exemplary embodiment, the semiconductor interconnect structure 10 is exposed to the annealing process 28 for a time from about 2 minutes to about 2 hours, and preferably for about one hour.

Figure 6A:
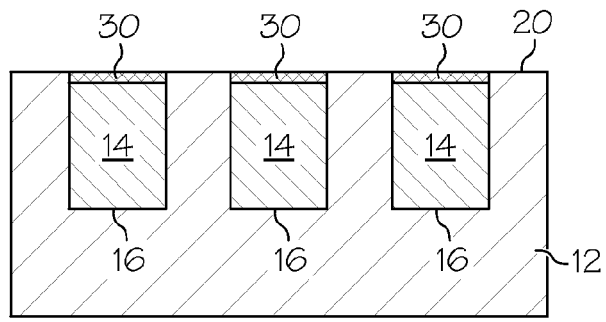
Figure 7A:
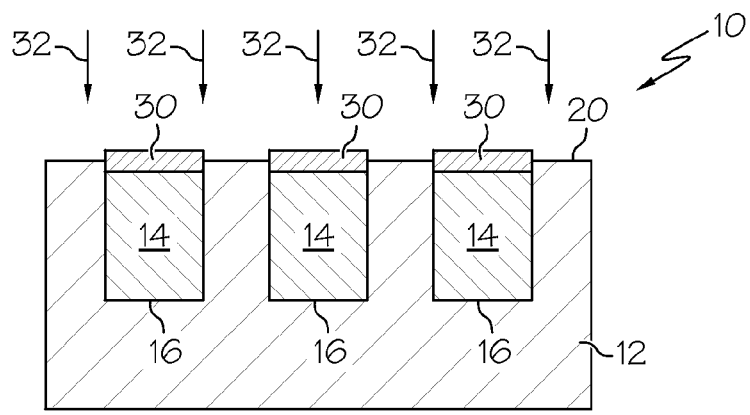

The remaining portion 29 of the oxide reducing metal layer 24 is removed from the semiconductor interconnect structure while leaving the metal oxide barrier layers 30 overlaying the copper lines 14 in place. In one embodiment as illustrated in FIG. 6A, the remaining portion 29 of the oxide reducing metal layer 24 is removed using a CMP process that results in the upper surface 20 of the ILD 12 being coplanar with the metal oxide barrier layers 30. In an alternative embodiment as illustrated in FIG. 7A, the remaining portion 29 of the oxide reducing metal layer 24 is removed by a selective wet etch process 32. The selective wet etch process 32 selectively etches the oxide reducing metal instead of etching or substantially etching the metal oxide barrier material. For example, etchants that selectively etch manganese or aluminum and not manganese oxide or aluminum oxide are commonly known and may be used. Some non-limiting examples of selective wet etchants are dilute acidic solutions such as dilute solutions of nitric acid or phosphoric acid. As illustrated in FIG. 7A, the selective wet etching process 32 may result in the metal oxide barrier layers 30 being slightly proud (e.g. non-coplanar) with the upper surface 20 of the ILD 12.

Figure 6B:
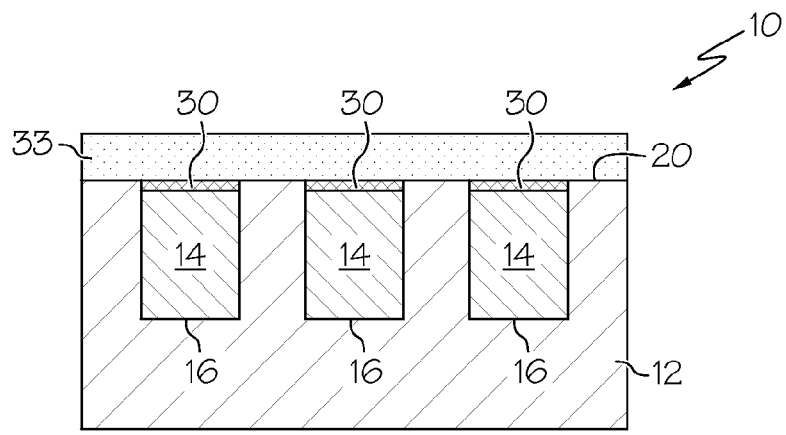
Figure 7B:
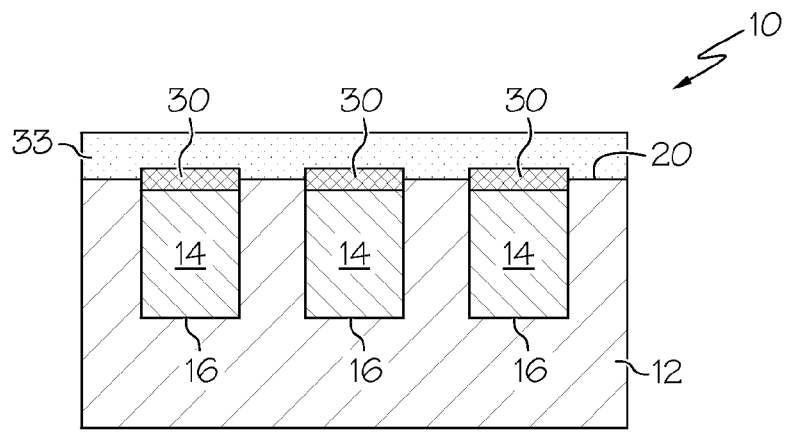

In at least one exemplary embodiment and as illustrated in FIGS. 6B and 7B, a dielectric cap material is deposited onto the metal oxide barrier layers 30 and the upper surface 20 of the ILD 12 to form a dielectric cap 33 on the basis of well-established deposition techniques. As illustrated in FIG. 6B, the dielectric cap 33 is disposed on a coplanar surface formed of the upper surface 20 of the ILD 12 and the metal oxide barrier layers 30. Alternatively and as illustrated in FIG. 7B, the dielectric cap 33 is disposed on a relatively non-coplanar surface formed of the upper surface 20 of the ILD 12 and the metal oxide barrier layers 30 that are slightly proud of the upper surface 20 of the ILD 12. The dielectric cap material preferably has a dielectric constant of about 5.5 or less. Non-limiting examples of dielectric cap materials include $Si_3N_4$, SiCN (N-Blok), and the like. The dielectric cap 33 acts as a diffusion barrier to prevent diffusion of copper from the copper lines 14 into the surrounding dielectric material (i.e. ILD 12).

Figure 5:
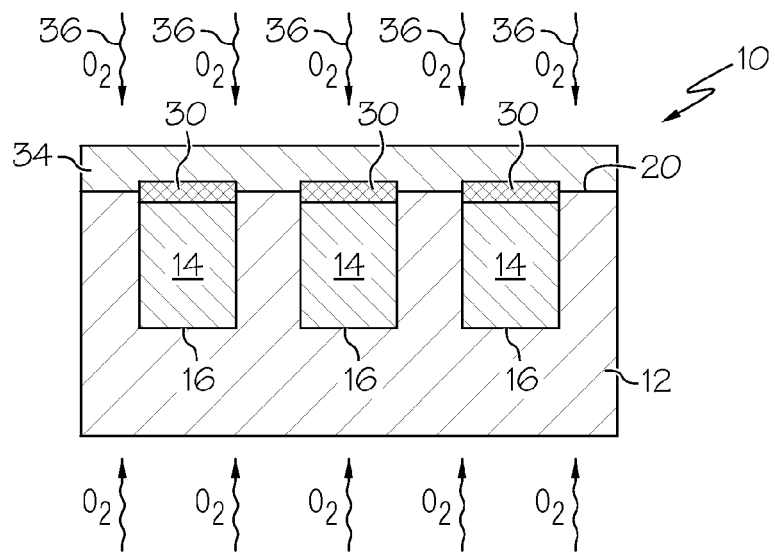

In an alternative embodiment as illustrated in FIG. 5, after or during the formation of the metal oxide barrier layers 30 as illustrated in FIG. 4, the remaining portion 29 of the oxide reducing metal layer 24 may also be oxidized to form an oxide metal layer 34. In particular, the semiconductor interconnect structure 10 covered with the oxide reducing metal layer 24 is subjected to an oxygen-rich annealing process 36, which may be used instead of the annealing process 28 illustrated in FIG. 4 or in addition to the annealing process 28, at conditions effective to oxidized the remaining portion 29 of the oxide reducing metal layer 24. In this embodiment, a CMP process is used to remove a substantial portion of the oxide metal layer 34 without removing the metal oxide barrier layers 30, resulting in the semiconductor interconnect structure 10 illustrated in FIG. 6A. Dielectric cap material is then deposited onto the upper surface 20 of the ILD 12 and the metal oxide barrier layers 30 to form the dielectric cap 33 as discussed in the foregoing paragraphs.

Accordingly, methods for forming a Cu diffusion barrier for a semiconductor interconnect structure have been described. The various embodiments include during intermediate stages of the fabrication of a semiconductor interconnect structure, an exposed outer portion of a copper line that is disposed along a dielectric substrate in a trench formed in the dielectric substrate is oxidize to form a copper oxide layer along the upper portion of the copper line. In an exemplary embodiment, the exposed outer portion of the copper line is oxidize by being exposed to ambient air and the thickness of the copper oxide layer may be increased or decreased as desired by using an annealing process that employs an oxidizing atmosphere or a reducing atmosphere, respectively. An oxide reducing metal is deposited onto the dielectric substrate covering the surface of the dielectric substrate and the copper oxide layer.

In an exemplary embodiment, the metal covered dielectric substrate is then annealed at conditions effective to cause an oxidation-reduction reaction between the copper oxide and the oxide reducing metal such that the copper oxide layer is reduced to copper and the portion of the oxide reducing metal immediately overlying and in contact with the copper oxide layer is oxidized to form a metal oxide barrier layer. In a preferred embodiment, the oxide reducing metal that is disposed laterally adjacent to the copper line overlying and in contact with the surface of the dielectric substrate is not oxidized. This results in the metal oxide barrier layer being naturally or self-aligned with the copper line without being formed onto or into the surrounding dielectric substrate which may otherwise result in current leakage issues. In one example, the oxide reducing metal is manganese, which reduces the copper oxide layer, and is oxidizes during the annealing process to form a manganese oxide layer that is a self-aligned barrier layer with the copper line. A selective wet etch process or a CMP process may then be used to remove the remaining manganese or other oxide reducing metal without removing the manganese oxide or other metal oxide that forms the barrier layer. A dielectric cap material is deposited onto the surface of the dielectric substrate and the magnesium oxide or other metal oxide barrier layer to form a dielectric cap. The metal oxide barrier layer inhibits copper electromigration or diffusion of copper atoms along the interface between the copper line and the dielectric cap of the semiconductor interconnect structure, which preferably results in improved reliability of the semiconductor device without the formation of voids or short circuits in the copper interconnect lines.

While at least one exemplary embodiment has been presented in the foregoing Detailed Description, it should be appreciated that a vast number of variations exist. It should also be appreciated that the exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention, it being understood that various changes may be made in the function and arrangement of elements described in an exemplary embodiment without departing from the scope of the invention as set forth in the appended Claims and their legal equivalents.f

What is claimed is:

1. A method for forming a Cu diffusion barrier for a semiconductor interconnect structure, the method comprising:
   oxidizing an exposed outer portion of a copper line that is disposed along a dielectric substrate to form a copper oxide layer;
   depositing an oxide reducing metal onto the copper oxide layer;
   reducing the copper oxide layer with at least a portion of the oxide reducing metal that oxidizes to form a metal oxide barrier layer; and
   depositing a dielectric cap over the metal oxide barrier layer.

2. The method according to claim 1, wherein depositing the oxide reducing metal includes depositing the oxide reducing metal that comprises manganese, aluminum, or a combination thereof.

3. The method according to claim 1, wherein reducing the copper oxide layer includes forming the metal oxide barrier layer that comprises manganese oxide, aluminum oxide, or a combination thereof.

4. The method according to claim 1, wherein oxidizing the exposed outer portion of the copper line includes exposing the exposed outer portion of the copper line to ambient to form the copper oxide layer.

5. The method according to claim 4, wherein oxidizing the exposed outer portion of the copper line includes annealing the copper oxide layer in a reducing atmosphere to decrease a thickness of the copper oxide layer after exposing the exposed outer portion of the copper line to ambient.

6. The method according to claim 4, wherein oxidizing the exposed outer portion of the copper line includes annealing the copper oxide layer in an oxygen-rich atmosphere to increase a thickness of the copper oxide layer after exposing the exposed outer portion of the copper line to ambient.

7. The method according to claim 1, wherein reducing the copper oxide layer includes reducing the copper oxide layer with a first portion of the oxide reducing metal to form the metal oxide barrier layer, and wherein the method further comprises removing a second portion of the oxide reducing metal.

8. The method according to claim 7, wherein removing the second portion includes removing the second portion using a CMP process.

9. The method according to claim 1, wherein reducing the copper oxide layer includes annealing the oxide reducing metal and the copper oxide layer at conditions effective to reduce the copper oxide layer with the oxide reducing metal to form the metal oxide barrier layer overlaying the copper line.

10. The method according to claim 9, wherein annealing the oxide reducing metal and the copper oxide layer includes exposing the oxide reducing metal and the copper oxide layer to a temperature of from about 200 to about 400° C.

11. The method according to claim 10, wherein annealing the oxide reducing metal and the copper oxide layer includes exposing the oxide reducing metal and the copper oxide layer to the temperature for a time of from about 2 minutes to about 2 hours.

12. The method according to claim 10, wherein annealing the oxide reducing metal and the copper oxide layer includes exposing the oxide reducing metal and the copper oxide layer to a temperature of from about 350 to about 400° C.

13. The method according to claim 9, wherein depositing the oxide reducing metal includes depositing the oxide reducing metal onto a surface of the dielectric substrate and the copper oxide layer, and wherein annealing the oxide reducing metal and the copper oxide layer includes annealing the oxide reducing metal and the copper oxide layer in an oxygen-rich atmosphere to form a metal oxide layer covering the surface of the dielectric substrate and the copper line, and wherein the method further includes removing a portion of the metal oxide layer covering the surface of the dielectric substrate adjacent to the copper line without removing a portion of the metal oxide layer disposed along the copper line to form the metal oxide barrier layer.

14. A method for forming a Cu diffusion barrier for a semiconductor interconnect structure, the method comprising:
   oxidizing an exposed outer portion of a copper line that is disposed along a dielectric substrate to form a copper oxide layer;
   depositing an oxide reducing metal onto the dielectric substrate and the copper oxide layer to form a metal covered dielectric substrate;
   annealing the metal covered dielectric substrate at conditions effective to cooperatively reduce the copper oxide layer and oxidize the oxide reducing metal to form a metal oxide barrier layer overlaying the copper line; and
   depositing a dielectric cap over the metal oxide barrier layer.

15. The method according to claim 14, wherein oxidizing the exposed outer portion of the copper line includes exposing the exposed outer portion of the copper line to ambient to form the copper oxide layer.

16. The method according to claim 15, wherein oxidizing the exposed outer portion of the copper line includes annealing the copper oxide layer in a reducing atmosphere to decrease a thickness of the copper oxide layer after exposing the exposed outer portion of the copper line to ambient.

17. The method according to claim 15, wherein oxidizing the exposed outer portion of the copper line includes annealing the copper oxide layer in an oxygen-rich atmosphere to increase a thickness of the copper oxide layer after exposing the exposed outer portion of the copper line to ambient.

18. The method according to claim 14, wherein annealing the metal covered dielectric substrate includes reducing the copper oxide layer with a first portion of the oxide reducing metal to form the metal oxide barrier layer, and wherein the method further comprises removing a second portion of the oxide reducing metal.

19. The method according to claim 14, wherein depositing the oxide reducing metal includes depositing the oxide reducing metal onto a surface of the dielectric substrate and the copper oxide layer, and wherein annealing the metal covered dielectric substrate includes annealing the oxide reducing metal and the copper oxide layer in an oxygen-rich atmosphere to form a metal oxide layer covering the surface of the dielectric substrate and the copper line, and wherein the method further includes removing a portion of the metal oxide layer covering the surface of the dielectric substrate adjacent to the copper line without removing a portion of the metal oxide layer disposed along the copper line that forms the metal oxide barrier layer.

20. The method according to claim 19, wherein removing the portion of the metal oxide layer covering the surface of the dielectric substrate includes removing the portion of the metal oxide layer using a CMP process.

* * * * *